(12) United States Patent
Taguchi et al.

(10) Patent No.: US 8,178,957 B2
(45) Date of Patent: May 15, 2012

(54) ELECTRONIC COMPONENT DEVICE, AND METHOD OF MANUFACTURING THE SAME

(75) Inventors: Yuichi Taguchi, Nagano (JP); Akinori Shiraishi, Nagano (JP); Mitsutoshi Higashi, Nagano (JP); Kei Murayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 184 days.

(21) Appl. No.: 12/704,146

(22) Filed: Feb. 11, 2010

(65) Prior Publication Data

US 2010/0207218 A1    Aug. 19, 2010

(30) Foreign Application Priority Data

Feb. 18, 2009   (JP) .................................. 2009-035674

(51) Int. Cl.
*H01L 29/72* (2006.01)
(52) U.S. Cl. ........ 257/678; 257/692; 257/698; 257/736; 257/737; 438/106; 438/589; 438/667
(58) Field of Classification Search .................. 257/678, 257/692, 698, 736, 737; 438/106, 589, 667
See application file for complete search history.

(56) References Cited

U.S. PATENT DOCUMENTS

| | | | |
|---|---|---|---|
| 6,391,742 B2 * | 5/2002 | Kawai | 438/456 |
| 6,583,514 B2 | 6/2003 | Tago | |
| 7,855,429 B2 * | 12/2010 | Ishida et al. | 257/528 |

FOREIGN PATENT DOCUMENTS

| | | |
|---|---|---|
| JP | 2002-110726 A1 | 4/2002 |
| JP | 2003-197806 A1 | 7/2003 |

* cited by examiner

*Primary Examiner* — Edward Wojciechowicz
(74) *Attorney, Agent, or Firm* — Kratz, Quintos & Hanson, LLP (57) ABSTRACT

A method of manufacturing an electronic component device, includes the steps of preparing a wiring substrate, which includes a silicon substrate, a concave portion provided on its upper surface side, a through hole formed to penetrate the silicon substrate on a bottom surface side of the concave portion, an insulating layer formed on the silicon substrate, a penetration electrode constructed by a lower conductor portion formed to a halfway position of a height direction from a bottom portion of the through hole and a connection metal member (indium layer) formed on the lower conductor portion in the through hole, and an electronic component having a terminal metal member (gold bump) on a lower surface side, and softening the connection metal member of the wiring substrate in a heating atmosphere and then sticking the terminal metal member of the electronic component into the connection metal member and connecting thereto.

10 Claims, 9 Drawing Sheets

ELECTRONIC COMPONENT DEVICE, AND METHOD OF MANUFACTURING THE SAME

CROSS-REFERENCE TO RELATED APPLICATIONS

This application is based on and claims priority of Japanese Patent Application No. 2009-035674 filed on Feb. 18, 2009, the entire contents of which are incorporated herein by reference.

BACKGROUND OF THE INVENTION

1. Field of the Invention

The present invention relates to an electronic component device and a method of manufacturing the same and, more particularly, an electronic component device in which an electronic component is mounted on a wiring substrate that employs a silicon substrate as a substrate and a method of manufacturing the same.

2. Description of the Related Art

In the prior art, there is the electronic component device which is constructed by mounting the electronic component on the wiring substrate. In Patent Literature 1 (Patent Application Publication (KOKAI) 2003-197806), it is set forth that, the wiring circuits are formed by filling the conductive paste into the groove patterns provided in the resin film, and then in a state that the inflated portion for air exhaust is formed to the chip mounting portion on the resin film, the bumps of the IC bare chip are stuck into the wiring circuits and are connected electrically thereto.

In Patent Literature 2 (Patent Application Publication (KOKAI) 2002-110726), it is set forth that, in the semiconductor device in which the electrodes on the semiconductor chip and the electrodes on the substrate are connected electrically to oppose mutually, in order to obtain the bonding portion whose reliability is high, the electrodes on the semiconductor chip and the electrodes on the substrate are bonded via the metallic compound layer which is formed of the desired electrode material and the bonding material.

As explained in the column in the related art described later, in the electronic component device in the related art, the MEMS component is mounted on the bottom portion of the concave portion of the wiring substrate using the silicon substrate as the substrate by the adhesive, and then the MEMS component is connected to the wiring substrate by wires.

In the related art, the MEMS component is connected to the wiring substrate by wires, and thus the area where the wire is drawn around is needed. Therefore, such a problem arises that the mounting area for mounting the MEMS component becomes large.

Also, like above Patent Literature 1, according to the approach of providing the inflated portion using a thermosetting resin in an element mounting position, it is difficult to connect the substrate and the semiconductor chip with good flatness. Also, in Patent Literature 1, the organic material is used as the substrate. Therefore, there is such a possibility that, because of difference of a coefficient of thermal expansion between the substrate and semiconductor chip, a warp is caused in the semiconductor device in the heating process in the manufacturing step. For this reason, in Patent Literature 1, terminal peeling of the semiconductor chip is prevented by employing the inflated portion using the thermosetting resin instead of the adhesive.

Also, some MEMS components need a high degree of parallelism. When the adhesive is used, in many cases, a degree of parallelism of the MEMS component is not always attained satisfactorily due to a variation in thickness of the adhesive, and the like.

SUMMARY OF THE INVENTION

It is an object of the present invention to provide an electronic component device capable of reducing a mounting area of an electronic component and also mounting the electronic component with a good degree of parallelism, and a method of manufacturing the same.

The present invention is concerned with an electronic component device, which includes a silicon substrate; a concave portion provided to an upper surface side of the silicon substrate; a through hole formed to penetrate the silicon substrate on a bottom surface side of the concave portion; an insulating layer formed on both surfaces of the silicon substrate and an inner surface of the through hole; a penetration electrode constructed by a lower conductor portion formed up to a halfway position of a height direction from a bottom portion of the through hole, and a connection metal member formed on the lower conductor portion in the through hole; and an electronic component mounted to a bottom portion of the concave portion, in which a terminal metal member of the electronic component is stuck into the connection metal member of the penetration electrode and connected thereto.

When the electronic component device of the present invention is manufactured, the connection metal member (indium layers, or the like) of the penetration electrodes of the wiring substrate is softened in a heating atmosphere, and the terminal metal member (gold bumps, or the like) of the electronic component is stuck into the connection metal members and is mounted thereon. In the present invention, the electronic component can be mounted to the wiring substrate not to provide the adhesive between the wiring substrate and the electronic component.

Accordingly, particularly in the case that the MEMS component (a sensor, or the like) which needs a high degree of parallelism in the attachment thereof should be mounted, the MEMS component can be mounted with good flatness. Therefore, the performance of the MEMS component can be drawn out sufficiently.

In the present invention, the adhesive, or the like is omitted in order to ensure a flatness in mounting of the electronic component, and then the terminal metal member of the electronic component is stuck into the connection metal member of the penetration electrode of the wiring substrate, whereby the terminal metal member and the connection metal member are connected by forming an metallic compound (indium-gold alloy, or the like) between them. As a consequence, when the number of penetration electrodes of the wiring substrate is small, the case that the connection strength (particularly, in the lateral direction) of the electronic component is insufficient may be assumed.

Therefore, in the present invention, the manufacturing method of the wiring substrate, in which the generation of notch can be prevented when the through holes are formed in the silicon substrate, should be employed. Therefore, the number of penetration electrodes per unit area can be increased, thus the electronic component can be mounted to the wiring substrate with sufficient connection strength without the adhesive. In addition, by forming the wiring substrate from silicon, occurrence of a warp caused due to difference in a coefficient of thermal expansion to the electronic component (silicon chip, or the like) can be reduced.

Also, the electronic component can be mounted without using the wire. Therefore, the mounting area can be reduced, and also a size reduction of the electronic component device can be achieved.

In the preferred mode of the present invention, the through holes in which the penetration electrodes are provided, of the wiring substrate, are formed on the basis of the following method, and the through holes are formed in a straight shape for the above reason. First, hole portions having a straight shape are formed in advance in the portions where the through holes are arranged, on the surface side of the silicon wafer by the half-etching, and then the insulating layer is formed on the whole surface of the silicon wafer.

Then, the opening portions are formed in the insulating layer on the back surface side of the silicon wafer. Then, the concave portions are formed by etching the silicon wafer while using the insulating layer as a mask until the concave portions reach the hole portions. After this, the concave portions and the through holes are obtained in the silicon wafer by removing the insulating layer.

By employing such method, the through holes are obtained from the hole portions which are formed up to the halfway position in the thickness of the silicon wafer. Therefore, the through holes can be formed with a straight shape.

Accordingly, the wiring substrate can deal with the narrower pitch between the through holes, and the penetration electrode can be filled up to the top portion of the through holes with good flatness. As a result, the gold bumps of the electronic component can be connected to the penetration electrodes with good reliability.

In this manner, in the present invention, the wiring substrate is formed of silicon, then the penetration electrode is formed in the through hole in which occurrence of the notch is suppressed preferably, and then the terminal metal member of the electronic component is stuck into the connection metal member of the penetration electrode to produce the metallic compound and then are connected thereto.

As explained above, in the present invention, a mounting area of the electronic component can be reduced, and also the electronic component can be mounted with a good degree of parallelism.

DETAILED DESCRIPTION OF THE PREFERRED EMBODIMENTS

Embodiments of the present invention will be explained with reference to the accompanying drawings hereinafter.

(Related Art)

Figure 1:
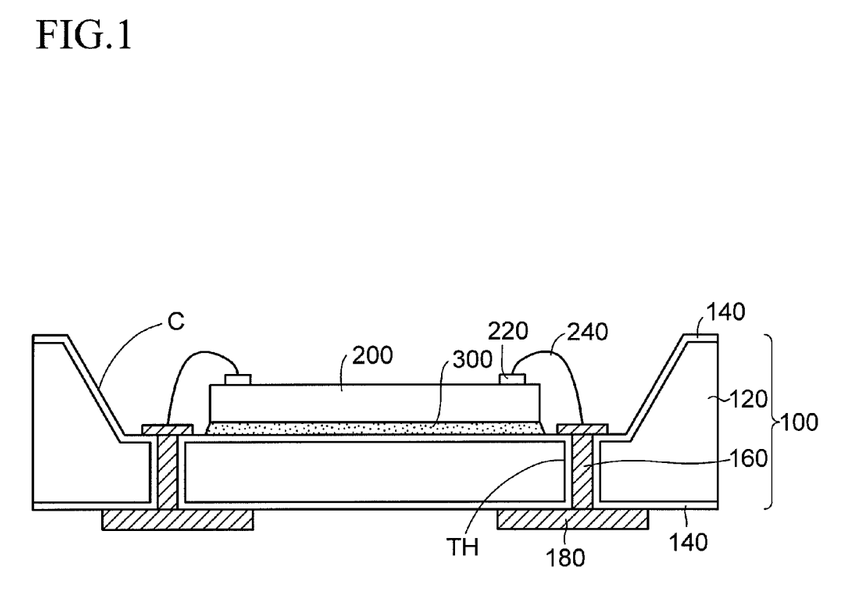
FIG. 1 is a sectional view showing an electronic component device in the related art.

Prior to the explanation of embodiments of the present invention, the problems in the related art associated with the present invention will be explained hereunder. FIG. 1 is a sectional view showing an electronic component device in the related art, and FIGS. 2A to 2E are sectional views showing a method of forming a concave portion and through holes in a silicon wafer in the related art.

As shown in FIG. 1, the electronic component device in the related art is basically constructed by mounting a MEMS component 200 on a wiring substrate 100. In the wiring substrate 100, a concave portion C (cavity) is provided in a center main portion on the upper surface side of a silicon substrate 120, and through holes TH penetrating in a thickness direction of the silicon substrate 120 are formed to the bottom surface side of the concave portion C. An insulating layer 140 is formed on both surfaces of the silicon substrate 120 and inner surfaces of the through holes TH.

Also, a penetration electrode 160 is filled in the through holes TH of the silicon substrate 120 respectively. Wiring layers 180 each connected to the penetration electrode 160 are formed on the lower surface side of the silicon substrate 120.

Then, the MEMS component 200 is mounted to be adhered onto a bottom surface of the concave portion C of the silicon substrate 120 by an adhesive 300. Then, connection electrodes 220 of the MEMS component 200 are connected electrically to the penetration electrodes 160 of the wiring substrate 100, which are arranged on the outside of the MEMS component 200, by a wire 240.

In the electronic component device in the related art, the MEMS component 200 is connected to the penetration electrodes 160 of the wiring substrate 100, which are arranged on the outside of the MEMS component 200, by the wire 240. Therefore, such a problem arises that a mounting area becomes large.

Also, upon mounting the MEMS component 200 such as a sensor, a high degree of parallelism is required in attaching the MEMS component 200 to the silicon substrate 120. In the electronic component device in the related art, the MEMS component 200 is adhered onto the concave portion C of the silicon substrate 120 by the adhesive 300. Therefore, the MEMS component 200 is apt to be fixed with an inclined state by a variation in thickness of the adhesive 300, or the like, and sometimes a sufficient degree of parallelism cannot be ensured.

Figure 2A:
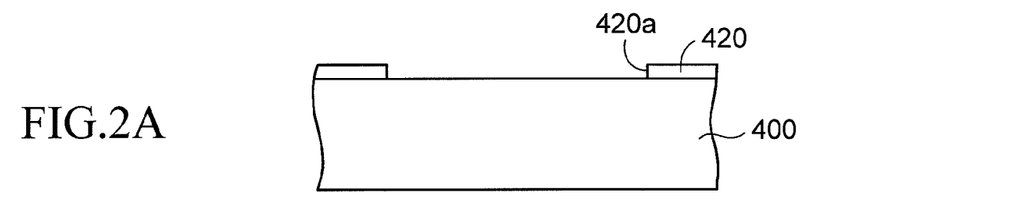
FIGS. 2A to 2E are sectional views showing a method of forming a concave portion and through holes in a silicon wafer in the related art.

Next, in the manufacture of the electronic component device in the related art, the problems caused in forming the concave portion and the through holes in the silicon wafer will be explained hereunder. As shown in FIG. 2A, first, an insulating layer 420 in which an opening portion 420a is provided is formed on a silicon wafer 400.

Figure 2B:
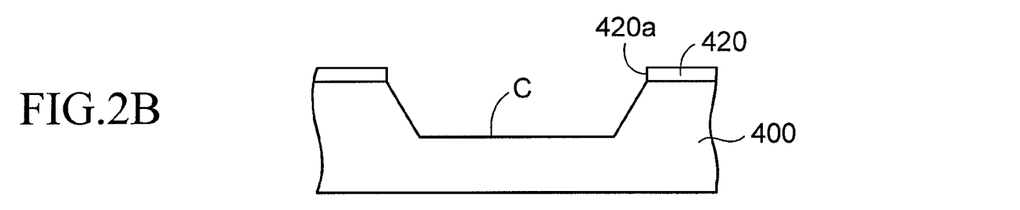

Then, as shown in FIG. 2B, the silicon wafer 400 is etched through the opening portion 420a by the wet etching while using the insulating layer 420 as a mask. Thus, the concave portion C is formed. Then, the insulating layer 420 is removed.

Figure 2C:
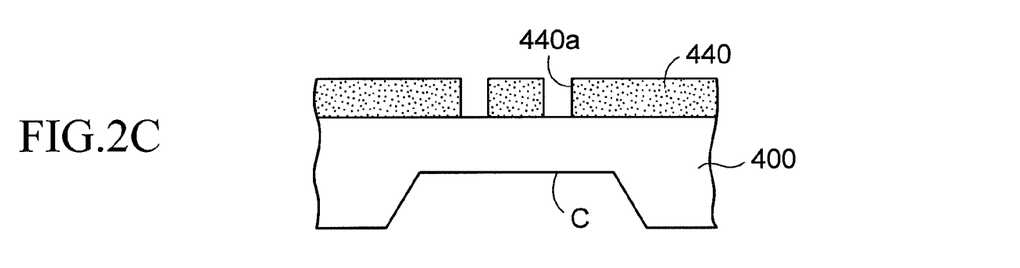

Then, as shown in FIG. 2C, the silicon wafer 400 is reversed up and down, and the back surface side thereof is directed upward, and then a resist 440 in which hole-like opening portions 440a are provided is formed on an upper surface of the silicon wafer 400. Then, the silicon wafer 400 is penetration-processed through the opening portions 440a by the anisotropic dry etching while using the resist 440 as a mask. Then, the resist 440 is removed.

Figure 2D:
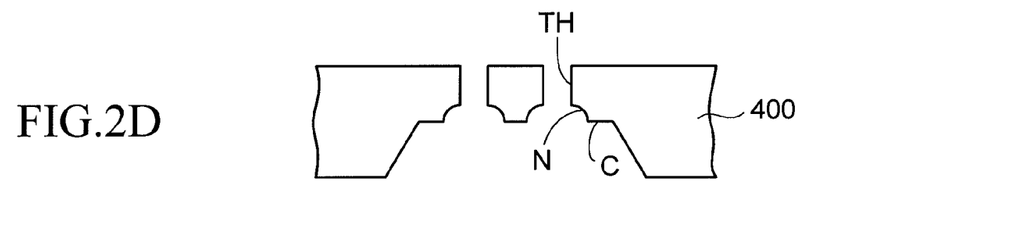

Accordingly, as shown in FIG. 2D, the through holes TH are formed in the silicon wafer 400 on the bottom portion side of the concave portion C.

However, in this method, there is such a problem that a notch N (notched portion) is generated to one end side of the through hole TH which is communicated with the concave portion C of the silicon wafer 400. As a result, particularly when a pitch between the through holes TH is narrowed, such a defect is caused that the through holes TH are linked together by the notch N.

The generation of the notches N in the through holes TH is caused by the fact that the plasma enters into the concave portions C after the through holes TH are formed. Accordingly, there is also such a problem that inner surfaces of the concave portions C are roughened.

Figure 2E:
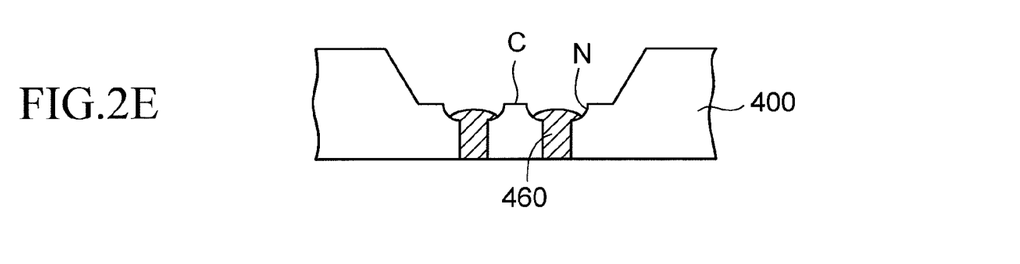

Then, as shown in FIG. 2E, a penetration electrode 460 is filled in the through holes TH respectively by applying the electroplating from the back surface side of the silicon wafer 400. At this time, the penetration electrode 460 cannot be filled up to upper portions of the through holes TH with good flatness by the influence of the notch N. As a result, it is feared that, as described later when the bumps of the electronic component are connected to the penetration electrodes 460 without using the wire, reliability becomes a problem.

Embodiments of the present invention that are explained hereinafter can solve the above-mentioned problems.

(Embodiments)

Figure 3:
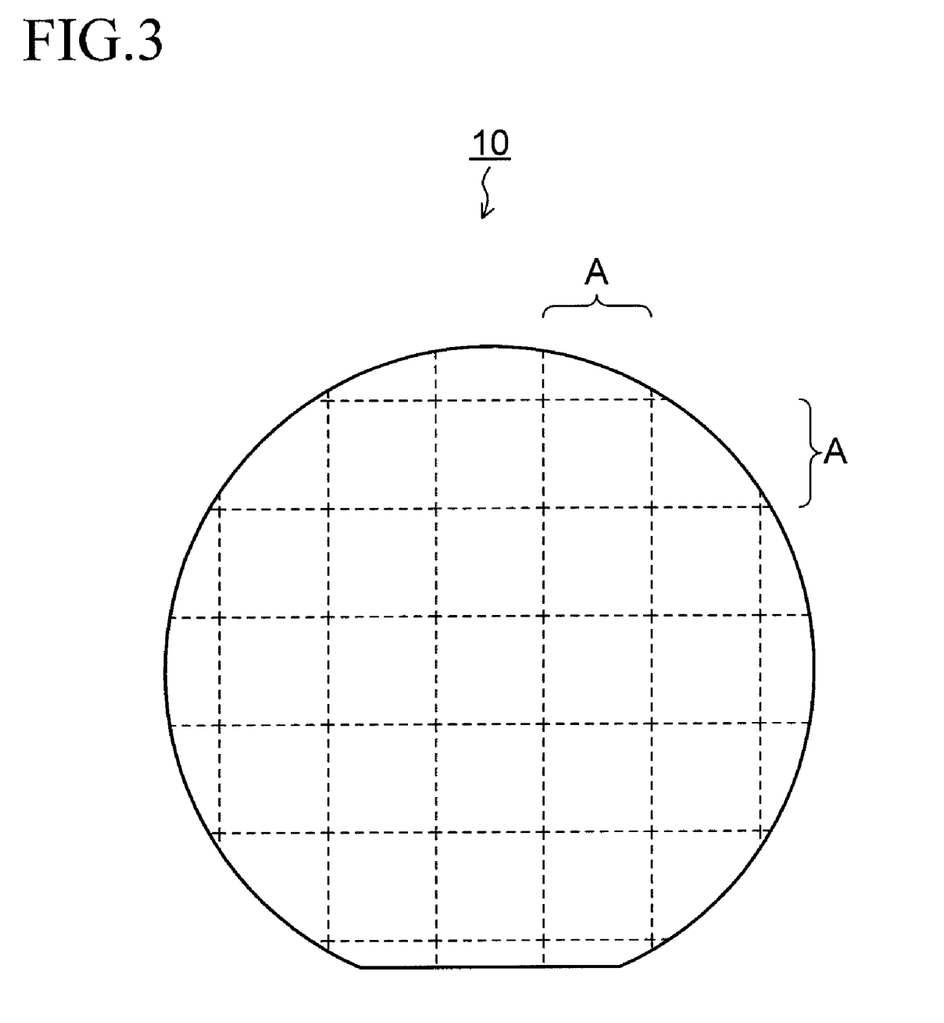
FIG. 3 is a sectional view (#1) showing a method of manufacturing an electronic component device according to an embodiment of the present invention.

FIG. 3 to FIG. 8 are sectional views showing a method of manufacturing an electronic component device according to an embodiment of the present invention. In the method of manufacturing an electronic component device according to the present embodiment, first, a silicon wafer 10 shown in FIG. 3 is prepared. A thickness of the silicon wafer 10 is set to 700 to 800 μm, for example, and a large number of wiring substrate areas A are defined on the silicon wafer 10.

Figure 4A:
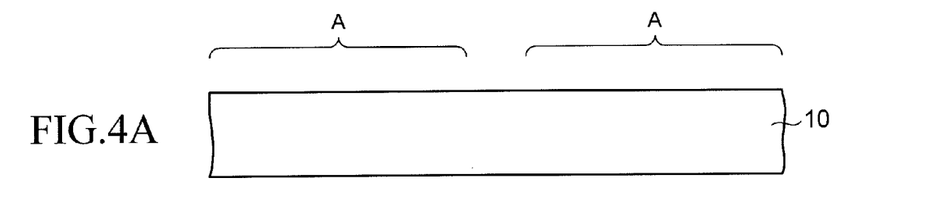
FIGS. 4A to 4D are sectional views (#2) showing the method of manufacturing the electronic component device according to the embodiment of the present invention.

Then, as shown in FIG. 4A, the back surface of the silicon wafer 10 is ground by the grinder. Thus, a thickness of the silicon wafer 10 is made thin to about 500 μm. In sectional views of FIG. 4A and subsequent Figures, two wiring substrate areas A of the silicon wafer 10 in FIG. 3 are depicted fragmentally.

Figure 4B:
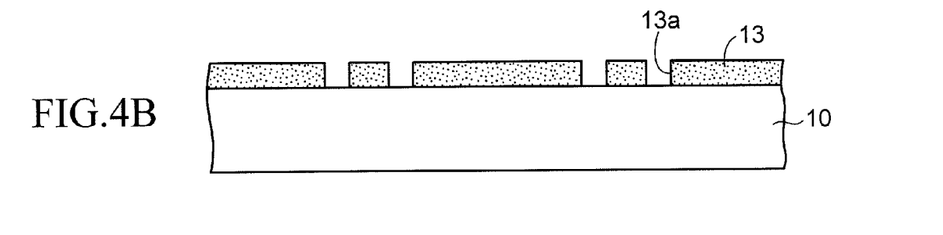

Then, as shown in FIG. 4B, a resist 13 in which hole-like opening portions 13a are provided is formed on the silicon wafer 10 by the photolithography. The opening portions 13a in the resist 13 are formed in portions where through holes are arranged in the silicon wafer 10.

Figure 4C:
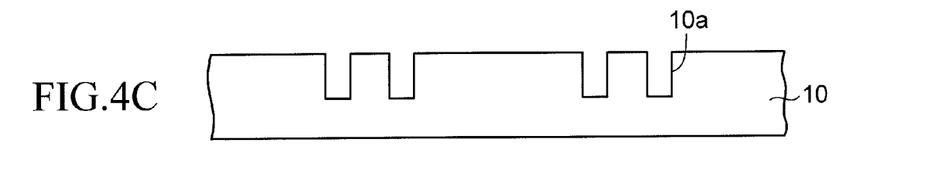

Then, as shown in FIG. 4C, the silicon wafer 10 is etched through the opening portions 13a by the anisotropic dry etching (RIE, or the like) while the resist 13 as a mask. At this time, the etching is applied until a halfway position of thickness of the silicon wafer 10, and a plurality of hole portions 10a are formed. Since the hole portions 10a are formed by half-etching the silicon wafer 10, no notch is generated to their inner surfaces and these hole portions 10a are formed with a straight shape.

In the case that a thickness of the silicon wafer 10 is set to 500 μm, a depth of the hole portion 10a is set to about 200 μm and a diameter of the hole portion 10a is set to 30 μm to 60 μm. Then, the resist 13 is removed.

Figure 4D:
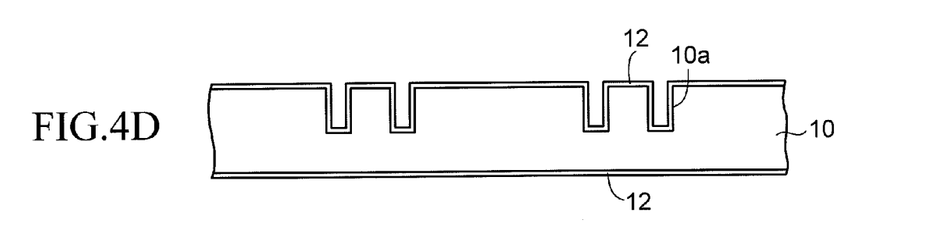

Then, as shown in FIG. 4D, an insulating layer 12 made of a silicon oxide layer is formed both surfaces of the silicon wafer 10 and inner surfaces of the hole portions 10a by thermally oxidizing the silicon wafer 10. Otherwise, the insulating layer 12 may be formed by forming a silicon oxide layer by the CVD method.

Figure 5A:
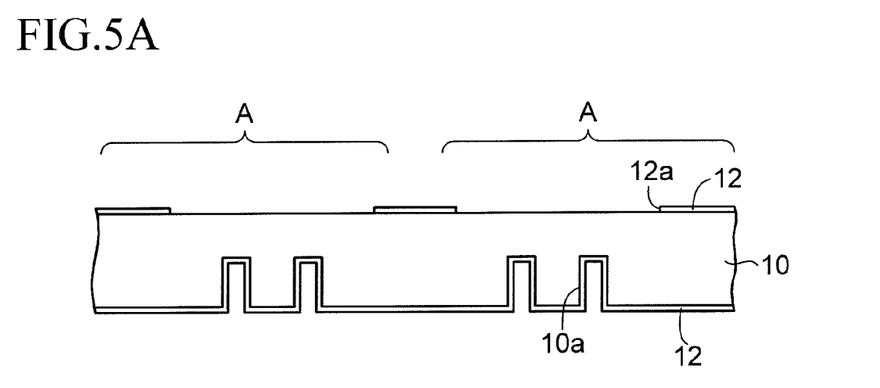
FIGS. 5A to 5C are sectional views (#3) showing the method of manufacturing the electronic component device according to the embodiment of the present invention.

Then, as shown in FIG. 5A, the silicon wafer 10 shown in FIG. 4D is reversed up and down and the back surface side thereof is directed upward, and then opening portions 12a are formed in the insulating layer 12 of an upper side. The insulating layer 12 is patterned by the photolithography and the wet etching. The opening portion 12a of the insulating layer 12 is arranged in the center main portion of each wiring substrate area A respectively.

Figure 5B:
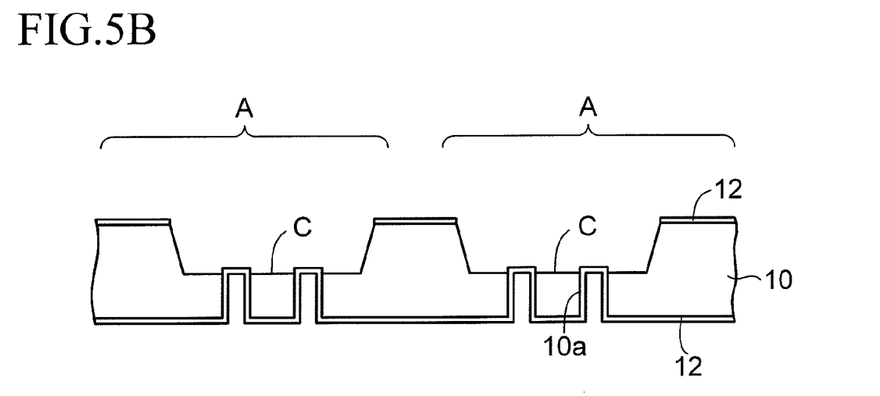

Then, as shown in FIG. 5B, the silicon wafer 10 is etched through the opening portions 12a by the wet etching while using the insulating layer 12 as a mask. Thus, a concave portion C (cavity) is formed in the center main portion of each wiring substrate area A. At this time, the concave portion C is formed with a depth that reaches the hole portion 10a formed in the silicon wafer 10.

Since the silicon wafer 10 is selectively etched with respect to the insulating layer 12, such a situation is obtained that the insulating layer 12 on the bottom portion side of the hole portion 10a protrudes to the upper side. Since the hole portions 10a are protected by the insulating layer 12 protruding to the upper side, such hole portions 10a are never etched excessively, and the through holes having a straight shape are obtained from the hole portions 10a.

By using the silicon wafer 10 whose surface orientation is (100), the concave portion C can be formed by the anisotropic wet etching. Also, the bottom surface of the concave portion C is formed in parallel with the substrate direction of the silicon wafer 10.

As described above, in the case that a thickness of the silicon wafer 10 is set to 500 μm and a depth of the hole portion 10a is set to 200 μm, a depth of the concave portion C is set to 300 μm or more.

Figure 5C:
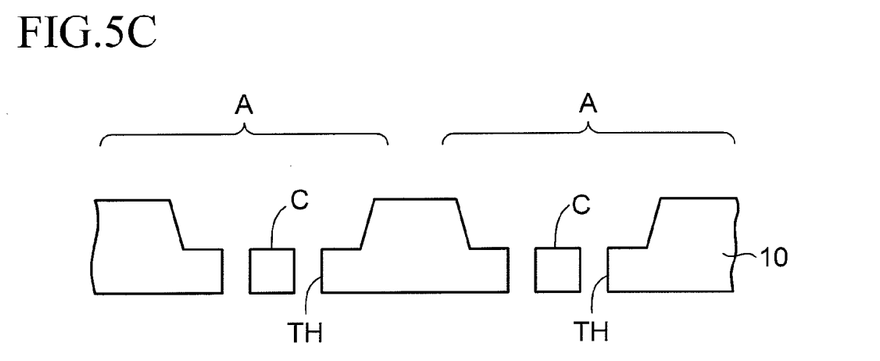

Then, as shown in FIG. 5C, the insulating layer 12 formed on the silicon wafer 10 is removed completely by the wet etching.

Accordingly, the concave portion C is obtained in the center main portions of the wiring substrate areas A on the upper surface side of the silicon wafer 10 respectively. At the same time, the insulating layer 12 formed around the above hole portions 10a is removed, and thus the through holes TH which penetrate the silicon wafer 10 are provided. The through holes TH are formed to communicate with the bottom portion of the concave portion C.

In this manner, in the manufacturing method of the present embodiment, first, the hole portions 10a are formed in advance to the portions where the through holes TH are arranged, on the surface side of the silicon wafer 10 by the half-etching, and then the insulating layer 12 is formed on the whole surface of the silicon wafer 10.

Then, the opening portions 12a are formed in the insulating layer 12 on the back surface side of the silicon wafer 10, and then silicon wafer 10 is etched until reaching the hole portions 10a while using the insulating layer 12 as a mask, thus the concave portions C are formed. Then, the concave portions C and the through holes TH are obtained in the silicon wafer 10 by removing the insulating layer 12.

By employing such method, the through holes TH are obtained from the hole portions 10a having a straight shape which are obtained by etching the silicon wafer 10 until a halfway position of its thickness. Therefore, unlike the above related art, the through holes TH can be formed with a straight shape.

The "straight shape" denotes a state that no notch (notched portion) is generated to the inner surface of the through hole TH. In this case, either a forward taper shape whose diameter of an upper portion is slightly larger than a diameter of a lower portion or a reverse taper shape whose diameter of an upper portion is slightly smaller than a diameter of a lower portion may be employed.

Figure 6A:
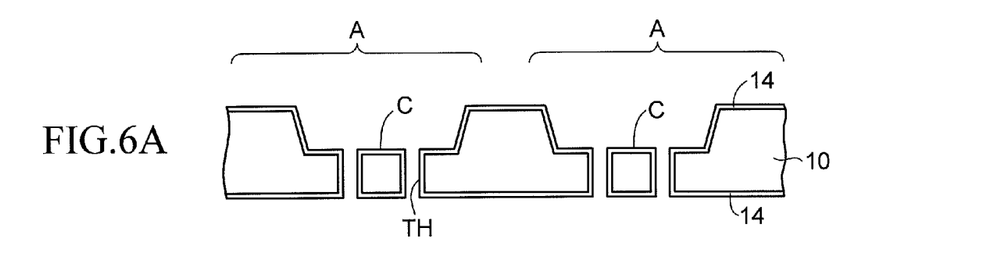
FIGS. 6A to 6C are sectional views (#4) showing the method of manufacturing the electronic component device according to the embodiment of the present invention.

Then, as shown in FIG. 6A, an insulating layer 14 made of a silicon oxide layer is formed on both surfaces of the silicon wafer 10 and inner surfaces of the through holes TH by thermally oxidizing the silicon wafer 10. Otherwise, a silicon oxide layer may be formed as the insulating layer 14 by the CVD method.

Figure 6B:
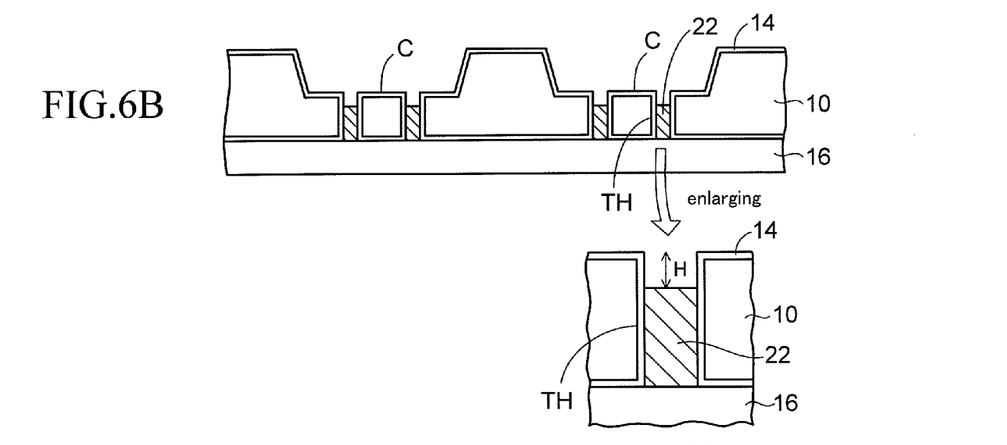

Then, as shown in FIG. 6B, the silicon wafer 10 shown in FIG. 6A is arranged on a plating power feeding member 16 such as a copper foil, or the like. Then, a copper (Cu) plating layer, or the like is filled in the through hole TH of the silicon wafer 10 from its lower portion to its upper side, by the electroplating utilizing the plating power feeding member 16 as a plating power feeding path. Thus, lower conductor portions 22 are formed.

The lower conductor portion 22 is formed in the through hole TH from its lower portion to a halfway position of its height, and such a situation is obtained that a depression portion H is left in the upper portion of the through hole TH. The lower conductor portion 22 is formed of a Cu plating layer, for example. In the case that a depth of the through hole TH is set to 200 μm, the lower conductor portion 22 is formed such that a depth of the depression portion H is set to about 30 μm.

Figure 6C:
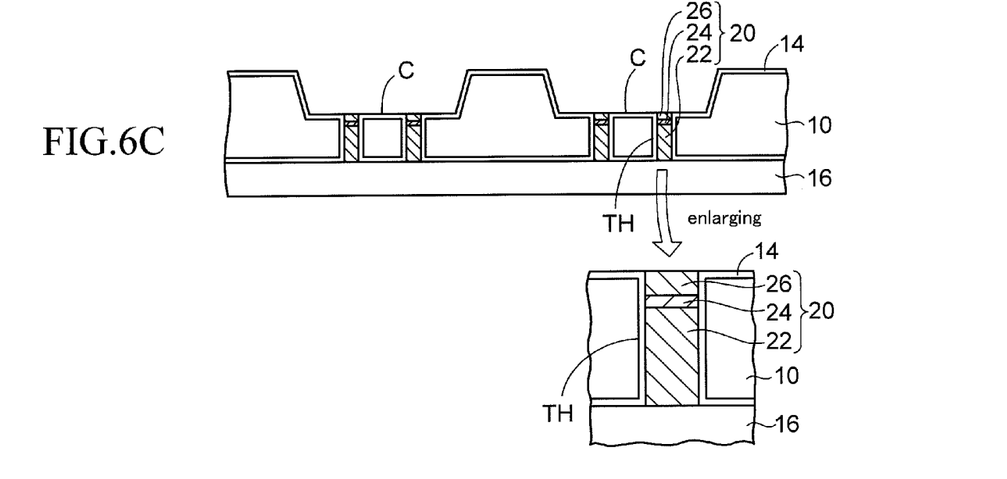

Then, as shown in FIG. 6C, a palladium (Pd) layer made of a thin film (e.g., thickness: 2 to 5 μm), or the like is formed on the lower conductor portion 22 in the through hole TH, by the similar electroplating utilizing the plating power feeding member 16 as a plating power feeding path. Thus, a metal barrier layer 24 is obtained.

Then, an indium (In) layer 26 (connection metal member) is filled in the depression portion H on the metal barrier layer 24 in the through hole TH, by the similar electroplating utilizing the plating power feeding member 16 as a plating power feeding path.

At this time, a quantity of plating is adjusted such that an upper surface of the indium layer 26 has an identical height with an upper surface of the insulating layer 14 on the concave portion C of the silicon wafer 10. Otherwise, the indium layer 26 may be filled such that this indium layer 26 is sunk slightly from the top portion of the through hole TH.

Also, upon forming the indium layer 26, the plating is applied until the protruding portion may be formed to the upper side of the through hole TH, and then the protruding portion may be planarized by grinding by means of the etching back or the polishing.

The metal barrier layer 24 functions as a barrier layer which prevents that the indium diffuses from the indium layer 26 into the lower conductor portion 22 when various heat treatments are applied, and thus an increase of an electrical resistance in the through hole TH, and the like can be prevented. Note that, in the case that the diffusion of indium into the lower conductor portion 22 does not cause any problem, the metal barrier layer 24 may be omitted and the indium layer 26 may be formed directly on the lower conductor portion 22.

In this manner, a penetration electrode 20 constructed by the lower conductor portion 22, the metal barrier layer 24, and the indium layer 26 from the bottom in order is filled in the through holes TH of the silicon wafer 10.

Here, the indium layer 26 is shown as the connection metal member of the penetration electrode 20 by way of example. But a tin (Sn) layer may be formed as the connection metal member.

Figure 7A:
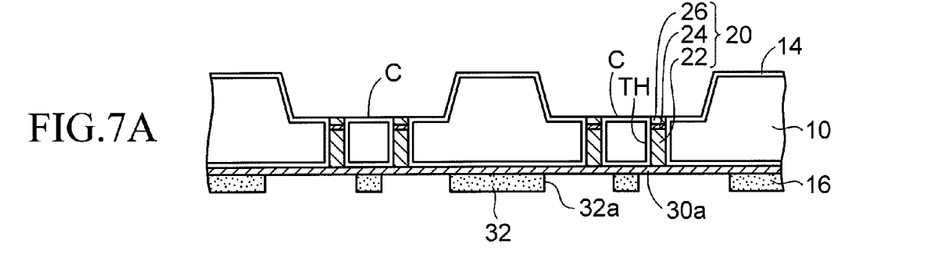
FIGS. 7A to 7D are sectional views (#5) showing the method of manufacturing the electronic component device according to the embodiment of the present invention.

Then, as shown in FIG. 7A, a Cu layer, or the like is formed on the lower surface side of the silicon wafer 10 by the electroless plating or the sputter method, and thus a seed layer 30a is obtained. Then, a plating resist 32 in which opening portions 32a are provided on areas where the wiring layer is arranged is formed on the seed layer 30a by the photolithography.

Figure 7B:
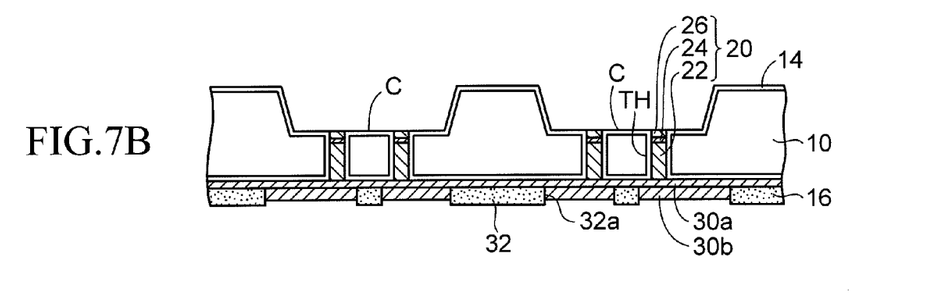

Then, as shown in FIG. 7B, a conductive pattern layer 30b made of a Cu layer, or the like is formed in the opening portions 32a in the plating resist 32, by the electroplating utilizing the seed layer 30a as a plating power feeding path. Then, the plating resist 32 is removed, and then the seed layer 30a is etched by using the conductive pattern layer 30b as a mask.

Figure 7C:
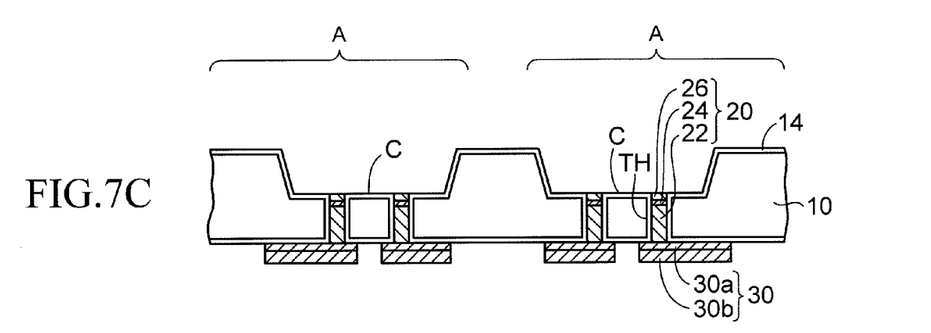

As a result, as shown in FIG. 7C, wiring layers 30 each constructed by the seed layer 30a and the conductive pattern layer 30b are formed on the insulating layer 14 on the lower surface side of the silicon wafer 10. The wiring layer 30 is formed to be connected electrically to the penetration electrode 20.

Figure 7D:
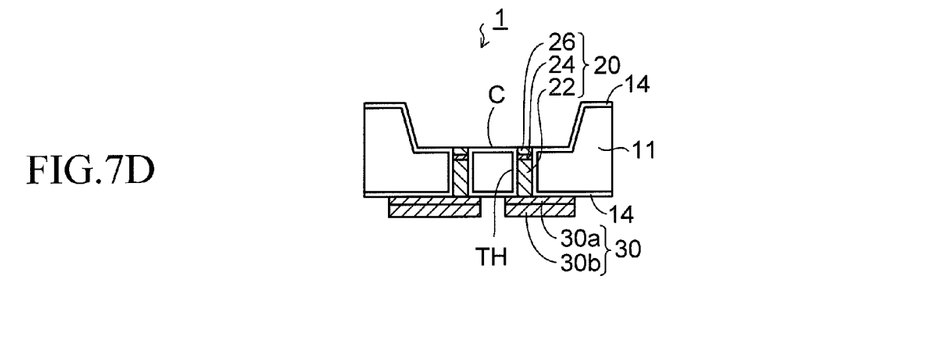

Then, as shown in FIG. 7D, the silicon wafer 10 is cut along boundary portions (see FIG. 3 together) of respective wiring substrate areas A. Thus, the silicon wafer 10 is divided into individual silicon substrates 11. Accordingly, a large number of wiring substrate areas A are separated respectively, and individual wiring substrates 1 are obtained.

Before or after the silicon wafer 10 is cut, external connection terminals may be provided on the connection portions of the wiring layers 30.

Figure 8:
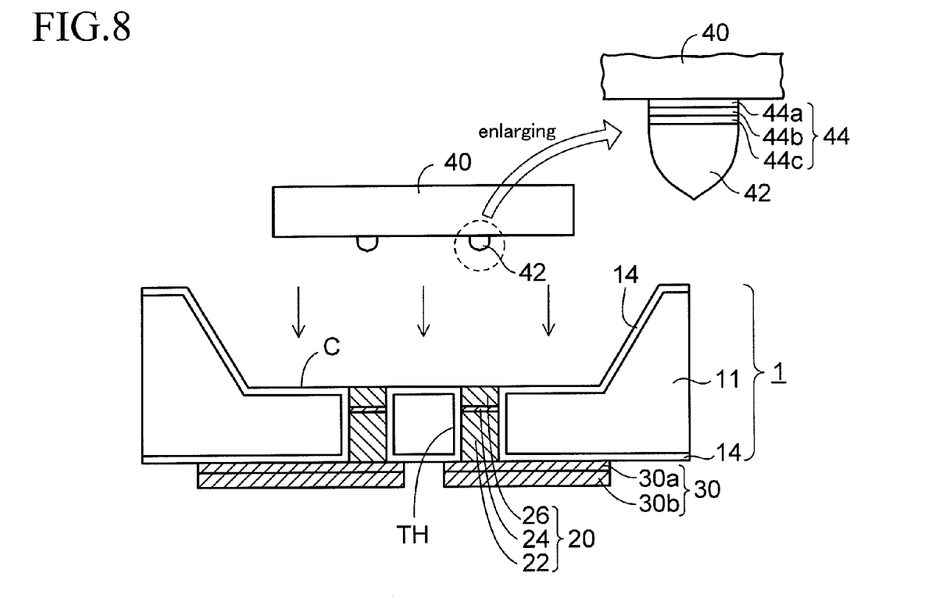
FIG. 8 is a sectional view (#6) showing the method of manufacturing the electronic component device according to the embodiment of the present invention.

Next, a method of mounting the electronic component on the wiring substrate 1 in FIG. 7D will be explained hereunder. As shown in FIG. 8, the wiring substrate 1 in FIG. 7D and an electronic component 40 are prepared. As shown in an enlarged view in FIG. 8, a connection pad 44 constructed by copper (Cu) layer 44a/nickel (Ni) layer 44b/gold (Au) layer 44c from the bottom in order is provided on the lower surface side of the electronic component 40. And a gold bump 42 (terminal metal member) is formed on the connection pad 44 (under the connection pad 44 in FIG. 8).

As the electronic component 40, a MEMS (Micro Electro Mechanical Systems) component, a semiconductor chip (LSI chip), various passive components such as a capacitor, and the like can be employed.

In this case, as the terminal metal member of the electronic component 40, the gold bump 42 is shown by way of example. In addition to gold (Au), copper (Cu), gold (Au) alloy, etc. may be employed as the material of the terminal metal member. In the case that the gold alloy is employed, palladium-containing gold is employed preferably.

Figure 9:
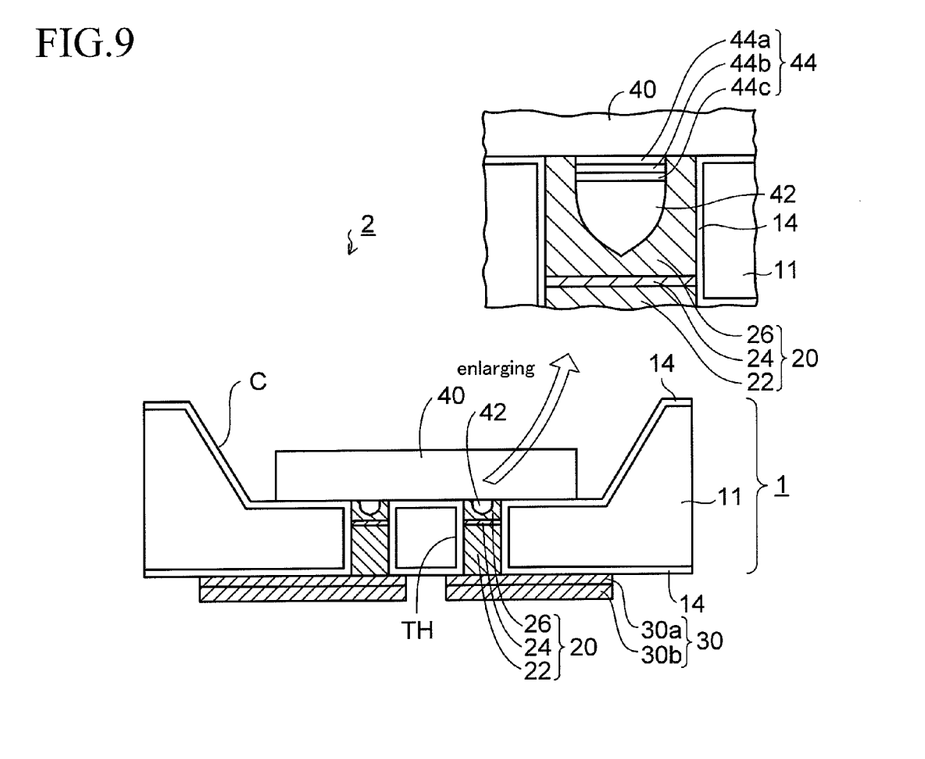
FIG. 9 is a sectional view showing an electronic component device according to the embodiment of the present invention.

Then, as shown in FIG. 8 and FIG. 9, a whole of gold bump 42 of the electronic component 40 is stuck into the uppermost indium layer 26 of the penetration electrodes 20 of the wiring substrate 1 and is buried therein in a heating atmosphere at a temperature of 200° C. Since the indium layer 26 is softened by the heat treatment at 200° C., the gold bump 42 of the electronic component 40 can be easily stuck into the indium layer 26. Then, the indium layer 26 is hardened by decreasing a temperature to a room temperature.

Accordingly, as shown in FIG. 9, the electronic component 40 is bonded to the silicon substrate 11 in such a state that the whole of gold bump 42 of the electronic component 40 is buried in the indium layer 26 of the penetration electrodes 20 of the wiring substrate 1. When the gold bump 42 of the electronic component 40 is stuck into the indium layer 26 of the wiring substrate 1 and is bonded thereto, the indium layer 26 reacts with the gold bump 42, so that the main portion of the indium layers 26 is changed into an indium-gold alloy.

Here, in the case that the copper bump is employed as the terminal metal member of the electronic component 40, similarly when the copper bump of the electronic component 40 is bonded to the indium layer 26, the indium layer 26 is changed into an indium-copper alloy. Also, in the case that the gold alloy bump is employed as the terminal metal member of the electronic component 40, similarly the indium layer 26 is changed into an indium-gold alloy.

Also, in the case that a tin layer is employed instead of the indium layer 26, such tin layer is softened by the heat treatment at 200° C. And when the gold bump 42 of the electronic component 40 is bonded similarly to the indium layer 26, the tin layer is changed into a tin-gold alloy. Also, when the copper bump of the electronic component 40 is bonded to the tin layer, the tin layer is changed into a tin-copper alloy. Further, when the gold alloy bump of the electronic component 40 is bonded to the tin layer, the tin layer is changed into a tin-gold alloy.

With the above, an electronic component device 2 of the present embodiment can be obtained.

As shown in FIG. 9, the electronic component device 2 of the present embodiment is basically constructed by mounting the electronic component 40 on the wiring substrate 1. In the wiring substrate 1, the concave portion C (cavity) is provided in the center main portion of the upper surface side of the silicon substrate 11, and the bottom surface of the concave portion C is formed in parallel with the substrate direction of the silicon substrate 11.

The through holes TH having a straight-shape that penetrate the silicon substrate 11 are provided on the bottom surface side of the concave portion C. The insulating layer 14 made of a silicon oxide layer is formed on both surfaces of the silicon substrate 11 and the inner surfaces of the through holes TH.

By providing the concave portion C in the center main portion of the silicon substrate 11, after the electronic component 40 is mounted on the concave portion C, the electronic component 40 can be hermetically sealed easily by providing a flat cap.

Also, the penetration electrode 20 constructed by forming the lower conductor portion 22 (Cu layer, or the like), the metal barrier layer 24 (Pd layer, or the like), and the indium layer 26 in order from the bottom is filled in the through holes TH respectively.

The wiring layers 30 each connected electrically to the penetration electrode 20 are formed on the insulating layer 14 on the lower surface of the silicon substrate 11.

Then, the electronic component 40 is bonded to the silicon substrate 11 in a state that the gold bumps 42 of the electronic component 40 are stuck into the indium layers 26 of the penetration electrodes 20 of the wiring substrate 1. As a result, the lower surface of the electronic component 40 is arranged to touch the bottom surface of the concave portion C of the silicon substrate 11 in a state that no clearance exists between them.

In this manner, in the electronic component device 2 of the present embodiment, a whole of the gold bump 42 of the electronic component 40 is stuck into the indium layer 26 of the penetration electrode 20 of the wiring substrate 1. Therefore, the lower surface of the electronic component 40 can be made to touch the bottom surface of the concave portion C of the silicon substrate 11 without a clearance.

In the present embodiment, the concave portion C can be formed by applying the anisotropic wet etching to the silicon substrate 11 whose surface orientation is (100). Therefore, the bottom surface of the concave portion C is formed in parallel with the substrate direction.

Accordingly, the electronic component 40 can be mounted in parallel with the substrate direction of the silicon substrate 11 more precisely than the case where the electronic component is adhered by the adhesive, like the above-mentioned related art. Therefore, the electronic component 40 can be mounted with good degree of parallelism.

Accordingly, particularly in the case that the MEMS component such as a sensor, or the like, which needs a high degree of parallelism, is mounted as the electronic component 40, such MEMS component can be mounted according to the required mounting specifications. Therefore, the performance of the MEMS component can be drawn out sufficiently.

In addition, the gold bump 42 of the electronic component 40 is stuck into the indium layer 26 of the wiring substrate 1. Therefore, the electronic component 40 can withstand particularly the mechanical stress applied from the lateral direction, so that reliability of the connection of the electronic component 40 can be improved.

Also, since the electronic component 40 is not connected by using the bonding wires unlike the above-mentioned related art, there is no need to ensure the wire bonding area on the outside of the electronic component 40. As a result, the mounting area can be made smaller than the related art, and thus a size reduction of the electronic component device 2 can be achieved.

Also, by employing the manufacturing method described above, the through holes TH having a straight shape can be formed stably. Accordingly, the electronic component device can deal with the narrower pitch between the through holes, and the penetration electrode 20 can be filled up to the top portions of the through holes TH with good flatness respectively. Therefore, the gold bumps 42 of the electronic component 40 can be connected to the penetration electrodes 20 with good reliability.

Also, in the present embodiment, the indium layers 26 of the wiring substrate 1 are softened by the heat treatment at about 200° C., and thus the gold bumps 42 of the electronic component 40 can be stuck into the indium layers 26 and be connected thereto. Therefore, for example, the lower-temperature heat treatment can be attained rather than the case where the gold (Au)-tin (Sn) bonding that needs the heat treatment of 300° C. or more is employed.

Accordingly, even when the materials whose coefficients of thermal expansion are different are employed in the electronic component device 2, since generation of a thermal stress can be suppressed to the utmost, it is convenient from the viewpoint of improving reliability of the electronic component device 2.

Also, in the electronic component device of the present embodiment, the indium layer 26 of the wiring substrate 1 is made of pure indium whose melting point is about 200° C. before the electronic component 40 is mounted on the wiring substrate 1. In contrast, after the electronic component 40 is mounted on the wiring substrate 1, the main portion of the indium layer 26 is changed into an indium-gold alloy whose melting point is about 400° C. That is, in the electronic component device 2 of the present embodiment, the indium layer 26 to which the gold bump 42 of the electronic component 40 is bonded contains the indium-gold alloy whose melting point is considerably higher than the indium.

In this manner, there is such an advantage that a melting point around the connection portion of the electronic component device 2 can be raised by mounting the electronic component 40 on the wiring substrate 1, and the electronic component device 2 can withstand the heat treatment that exceeds 200° C.

Accordingly, a flexibility of the heat treatment process applied after the electronic component device 2 is constructed can be widened. For example, when the external connection terminals provided to the wiring layers 30 of the electronic component device 2 are connected to the connection portions of the mounting substrate, the Au—Sn bonding that needs the heat treatment at about 300° C. can also be employed.

In the case that the indium layer 26 is not changed into the gold alloy, when the heat treatment that exceeds 200° C. is applied, the indium layer 26 begins to melt out. As a result, it is needless to say that reliability of the connections in the electronic component device 2 is lowered.

Meanwhile, the connection strength of the electronic component 40 will be mentioned hereunder. Unlike the present embodiment, in the case that the electronic component 40 is adhered to the wiring substrate 1 by the epoxy-based adhesive, the connection strength of 20 N per 1 mm$^2$ is possessed. In contrast, the indium-gold connection has the connection strength of 73 N per 1 mm$^2$, and the connection strength can be strengthened rather than the epoxy-based adhesive. For example, in the indium-gold connection, the connection strength of about 15 N can be obtained when the number of the penetration electrodes 20 (number of the gold bumps 42 of the electronic component 40) is 10.

As described above, in the present embodiment, since the through holes TH of the wiring substrate 1 are formed with a straight shape, the number of the penetration electrodes 20 per unit area can be increased. Therefore, an improvement of the connection strength can be achieved.

Figure 10:
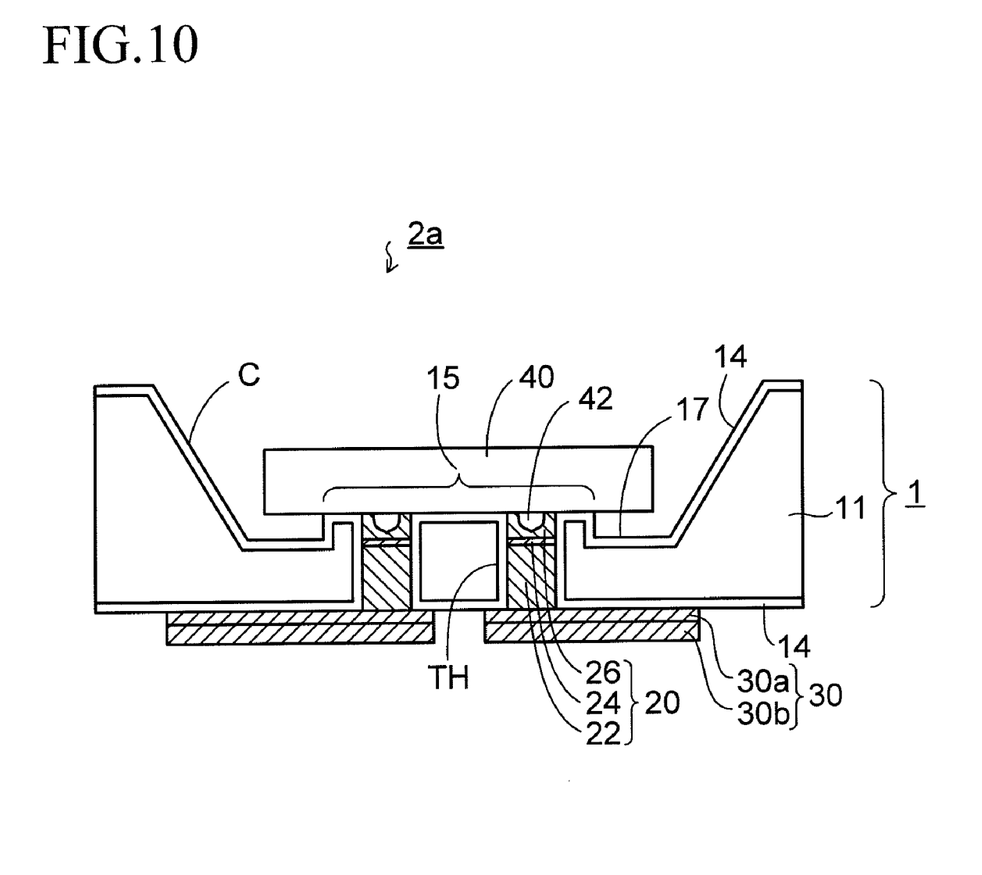
FIG. 10 is a sectional view showing an electronic component device according to a variation of the embodiment of the present invention.

In FIG. 10, an electronic component device 2a according to a variation of the embodiment of the present invention is shown. As shown in FIG. 10, in the wiring substrate 1 of the electronic component device 2a according to the variation, a projection mounting portion 15 having trapezoidal shape protruding upward than the peripheral portion of the concave portion C is provided in the center portion of the bottom surface of the concave portion C, and an engraved portion 17 arranged with a ring shape is provided to the outside of the projection mounting portion 15.

Then, the gold bump 42 of the electronic component 40 is stuck into the indium layer 26 in the projection mounting portion 15 of the wiring substrate 1 and is bonded thereto. An area of the projection mounting portion 15 of the wiring substrate 1 is set smaller than an area of the electronic component 40, and the peripheral side of the electronic component 40 is arranged over the engraved portion 17 of the wiring substrate 1. That is, the peripheral side of the electronic component 40 does not contact the wiring substrate 1, and is kept in a free condition.

In FIG. 10, remaining elements are similar to those in the electronic component device 2 in FIG. 9, and therefore their explanation will be omitted herein by attaching the same reference symbols to them.

In the electronic component device 2a according to the variation, the piezo-resistance type sensor (MEMS component), etc. are mounted preferably as the electronic component 40. For example, the piezo-resistance type acceleration sensor utilizes such an effect that a resistivity is changed because a strain corresponding to the applied acceleration is applied to the silicon substrate 11.

As a result, a state that a part of the electronic component 40 is kept in a free condition, can relieve a stress more easily than a state that a whole of the electronic component 40 (acceleration sensor) is fixed, and reliability in the time of the operation can be improved.

The electronic component device 2a according to the variation can achieve the similar advantages to those of the above electronic component device 2.

What is claimed is:

1. An electronic component device, comprising:
   a silicon substrate;
   a concave portion provided to an upper surface side of the silicon substrate;
   a through hole formed to penetrate the silicon substrate of a bottom surface side of the concave portion;
   an insulating layer formed on both surfaces of the silicon substrate and an inner surface of the through hole;
   a penetration electrode constructed by a lower conductor portion formed up to a halfway position of a height direction from a bottom portion of the through hole, and a connection metal member formed on the lower conductor portion in the through hole; and
   an electronic component mounted to a bottom portion of the concave portion, in which a terminal metal member of the electronic component is stuck into the connection metal member of the penetration electrode and connected thereto.

2. An electronic component device according to claim 1, wherein the through hole has a straight shape, and a lower surface of the electronic component touches a bottom surface of the concave portion.

3. An electronic component device according to claim 1, wherein the connection metal member of the penetration electrode is made of indium or tin, and the terminal metal member of the electronic component is made of copper, gold, or gold alloy.

4. An electronic component device according to claim 1, wherein a metal barrier layer is formed between the lower conductor portion and the connection metal member.

5. An electronic component device according to claim 1, wherein the electronic component is a MEMS component.

6. A method of manufacturing an electronic component device, comprising the steps of:
   preparing
   a wiring substrate obtained by a method that includes the steps of
      forming a hole portion by processing a silicon wafer on which a plurality of wiring substrate areas are defined, until a halfway position of a thickness direction,
      forming an insulating layer on both surfaces of the silicon wafer and an inner surface of the hole portion,
      reversing the silicon wafer up and down to direct a back surface side upward, and forming an opening portion in the insulating layer on an upper surface side of the silicon wafer,
      forming a concave portion by processing the silicon wafer until reaching the hole portion, while using the insulating layer as a mask,
      obtaining the concave portion and a through hole having a straight shape, which communicates with the concave portion and is formed from the hole portion, in the silicon wafer, by removing the insulating layer,
      forming an insulating layer on both surfaces of the silicon wafer and an inner surface of the through hole, and obtaining a penetration electrode by forming a lower conductor portion and a connection metal member in the through hole in order by means of an electroplating, and an electronic component having a terminal metal member to a lower surface side thereof; and mounting the electronic component on the concave portion of the wiring substrate, by softening the connection metal member of the wiring substrate in a heating atmosphere and then sticking the terminal metal member of the electronic component into the connection metal member and connecting thereto.

7. A method of manufacturing an electronic component device, according to claim 6, wherein, in the step of mounting the electronic component on the wiring substrate, a lower surface of the electronic component is arranged to touch a bottom surface of the concave portion.

8. A method of manufacturing an electronic component device, according to claim 6, wherein the connection metal member of the penetration electrode is made of indium or tin, and the terminal metal member of the electronic component is made of copper, gold, or gold alloy.

9. A method of manufacturing an electronic component device, according to claim 6, wherein the connection metal member of the penetration electrode is made of indium, and the terminal metal member of the electronic component is made of gold, and in the step of mounting the electronic component on the wiring substrate, an indium-gold alloy obtained by reacting with the terminal metal member of the electronic component is formed in the connection metal member of the wiring substrate.

10. A method of manufacturing an electronic component device, according to claim 6, wherein the electronic component is a MEMS component.

* * * * *